United States Patent
Toujo

(10) Patent No.: US 11,264,162 B2
(45) Date of Patent: Mar. 1, 2022

(54) COIL COMPONENT AND FILTER CIRCUIT INCLUDING THE COIL COMPONENT

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/155,198

(22) Filed: Jan. 22, 2021

(65) Prior Publication Data

US 2021/0151241 A1 May 20, 2021

Related U.S. Application Data

(63) Continuation of application No. PCT/JP2020/024407, filed on Jun. 22, 2020.

(30) Foreign Application Priority Data

Sep. 20, 2019 (JP) .............................. JP2019-171771

(51) Int. Cl.
*H01F 27/28* (2006.01)
*H03H 7/01* (2006.01)
(Continued)

(52) U.S. Cl.
CPC ......... *H01F 27/2804* (2013.01); *H01F 27/29* (2013.01); *H01F 27/40* (2013.01);
(Continued)

(58) Field of Classification Search
CPC .......... H03H 2001/0085; H03H 7/0115; H01F 2027/2809; H01F 27/29; H01F 5/003
(Continued)

(56) References Cited

U.S. PATENT DOCUMENTS 6,476,689 B1  11/2002 Uchida et al.
9,064,626 B2 *  6/2015 Yoo ..................... H01F 27/2804
(Continued)

FOREIGN PATENT DOCUMENTS

JP     2001-160728 A    6/2001
JP     2018-186417 A    11/2018
(Continued)

OTHER PUBLICATIONS

Official Communication issued in International Patent Application No. PCT/JP2020/024407, dated Aug. 18, 2020.

*Primary Examiner* — Rakesh B Patel

(74) *Attorney, Agent, or Firm* — Keating & Bennett, LLP

(57) ABSTRACT

A coil component includes a first coil and a second coil that are magnetically coupled to each other. The coil component includes a multilayer body, first wiring patterns, second wiring patterns, and third wiring patterns. The first coil includes a portion in which the first wiring patterns and the third wiring patterns are electrically connected to each other by a first via conductor and a second via conductor through the first wiring patterns and the third wiring pattern to connect the wiring patterns in parallel. The second coil includes a portion in which the second wiring patterns and the third wiring patterns are electrically connected to each other by a third via conductor and a fourth via conductor through the second wiring patterns and the third wiring pattern to connect the wiring patterns in parallel.

18 Claims, 6 Drawing Sheets

(51) Int. Cl.
    *H01F 27/29*     (2006.01)
    *H01F 27/40*     (2006.01)
    *H03H 1/00*     (2006.01)

(52) U.S. Cl.
    CPC ............ *H03H 1/00* (2013.01); *H03H 7/0115* (2013.01); *H01F 2027/2809* (2013.01); *H03H 2001/0085* (2013.01)

(58) Field of Classification Search
    USPC ........................................................ 333/185
    See application file for complete search history.

(56) References Cited

U.S. PATENT DOCUMENTS

| | | |
|---|---|---|
| 2018/0069524 A1 | 3/2018 | Ishizuka |
| 2018/0316330 A1 | 11/2018 | Kitami et al. |
| 2019/0051440 A1 | 2/2019 | Ueki |

FOREIGN PATENT DOCUMENTS

| | | |
|---|---|---|
| WO | 2017/002661 A1 | 1/2017 |
| WO | 2018/012400 A1 | 1/2018 |

\* cited by examiner

COIL COMPONENT AND FILTER CIRCUIT INCLUDING THE COIL COMPONENT

CROSS REFERENCE TO RELATED APPLICATIONS

This application claims the benefit of priority to Japanese Patent Application No. 2019-171771 filed on Sep. 20, 2019 and is a Continuation Application of PCT Application No. PCT/JP2020/024407 filed on Jun. 22, 2020. The entire contents of each application are hereby incorporated herein by reference.

BACKGROUND OF THE INVENTION

1. Field of the Invention

The present disclosure relates to a coil component and a filter circuit including the coil component.

2. Description of the Related Art

Measures against noise using filter circuits are frequently performed in electronic devices. The filter circuit used for the measures against noise is, for example, an electromagnetic interference (EMI) filter. The EMI filter transmits necessary components in current flowing through a conductor and removes unnecessary component therein. In addition, since the filter circuit uses a capacitor, which is a capacitance element, a noise suppression effect is known to be reduced due to equivalent series inductance (ESL), which is parasitic inductance of the capacitor.

Technologies are known to cancel the equivalent series inductance ESL of the capacitor using negative inductance occurring from magnetic coupling between two coils to improve the noise suppression effect of the filter circuit (for example, Japanese Unexamined Patent Application Publication No. 2001-160728).

In order to cancel the equivalent series inductance ESL of the capacitor, it is necessary to appropriately adjust mutual inductance M of the two coils. Although the high mutual inductance M is achieved because the two coils are provided in a magnetic body in an LC filter according to Japanese Unexamined Patent Application Publication No. 2001-160728, it is difficult to appropriately adjust the mutual inductance M in accordance with the equivalent series inductance ESL to be canceled.

In addition, when the filter circuit is used in a power supply line, it is necessary to cause large direct current to flow through the coils. If a portion at which the current is concentrated occurs in the wiring of the coils because of the large direct current that flows through the coils, heat may possibly be generated at the portion.

SUMMARY OF THE INVENTION

Preferred embodiments of the present invention provide coil components that are each capable of reducing or preventing a concentration of current in a wiring of coils to appropriately adjust mutual inductance of the coils, and provide filter circuits each including such a coil component.

A coil component according to a preferred embodiment of the present disclosure includes a first coil and a second coil that are magnetically coupled to each other. The coil component includes a ceramic body that includes multiple ceramic layers that include a pair of main surfaces that are opposed to each other and side surfaces with which the main surfaces are connected, multiple first wiring patterns that are laminated in the ceramic body and that define a portion of the first coil, multiple second wiring patterns that are laminated above the first wiring patterns and that define a portion of the second coil, and multiple third wiring patterns that are laminated between the first wiring patterns and the second wiring patterns and that include a portion defining a portion of the first coil and a portion defining a portion of the second coil. The first coil includes a portion in which the multiple first wiring patterns are electrically connected to each other by a first via conductor to connect the multiple wiring patterns in parallel and a portion in which the multiple first wiring patterns and the multiple third wiring patterns are electrically connected to each other by a second via conductor and a third via conductor through the multiple first wiring patterns and the multiple third wiring patterns to connect the multiple wiring patterns in parallel. The second coil includes a portion in which the multiple second wiring patterns are electrically connected to each other by a fourth via conductor to connect the multiple wiring patterns in parallel and a portion in which the multiple second wiring patterns and the multiple third wiring patterns are electrically connected to each other by a fifth via conductor and a sixth via conductor through the multiple second wiring patterns and the multiple third wiring patterns to connect the multiple wiring patterns in parallel. The ceramic body includes a first electrode electrically connected to the first wiring patterns, a second electrode electrically connected to the second wiring patterns, and a third electrode electrically connected to the third wiring patterns electrically connected to each other by a seventh via conductor.

A filter circuit according to a preferred embodiment of the present disclosure includes the coil component and a capacitor connected to the third electrode of the coil component.

According to preferred embodiments of the present disclosure, since the coil components each include the second via conductor and the third via conductor through the multiple first wiring patterns and the multiple third wiring patterns and the fifth via conductor and the sixth via conductor through the multiple second wiring patterns and the multiple third wiring patterns, it is possible to reduce or prevent concentration of current in the wiring of the coils to appropriately adjust the mutual inductance of the two coils. Accordingly, the parallel connection of the inductances is provided at multiple portions to reduce or prevent heat generation in the coils.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail with reference to the accompanying drawings.

A coil component according to a preferred embodiment of the present invention and a filter circuit including the coil component will herein be described.

Figure 1:
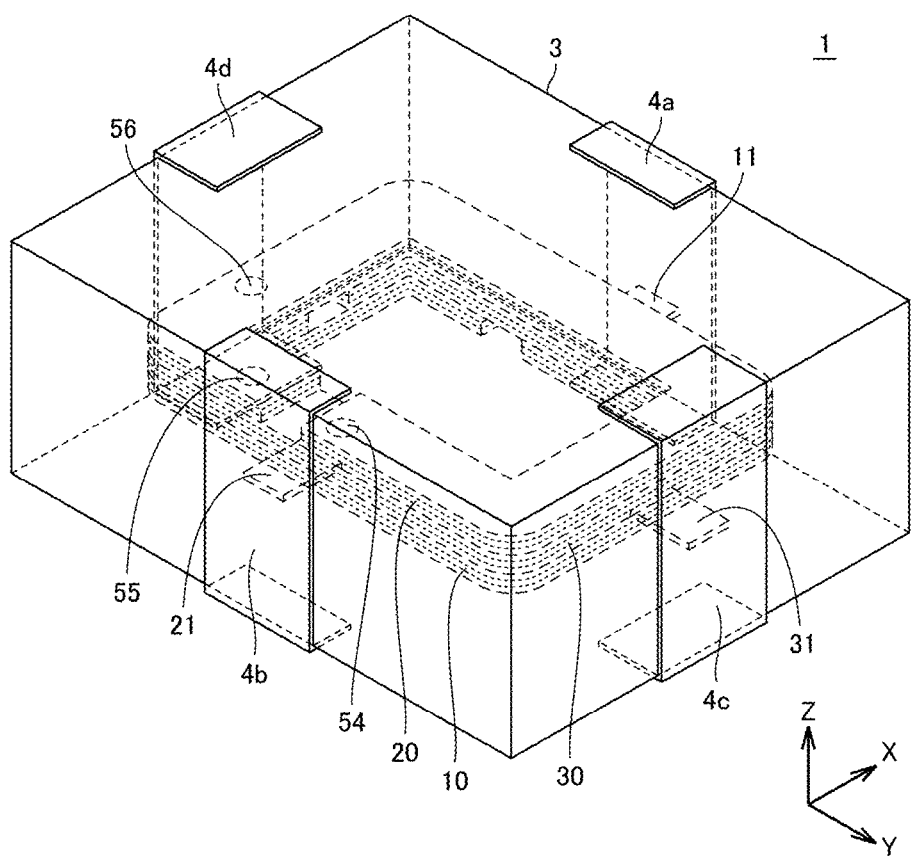
FIG. 1 is a perspective view of a coil component according to a preferred embodiment of the present invention.
Figure 2:
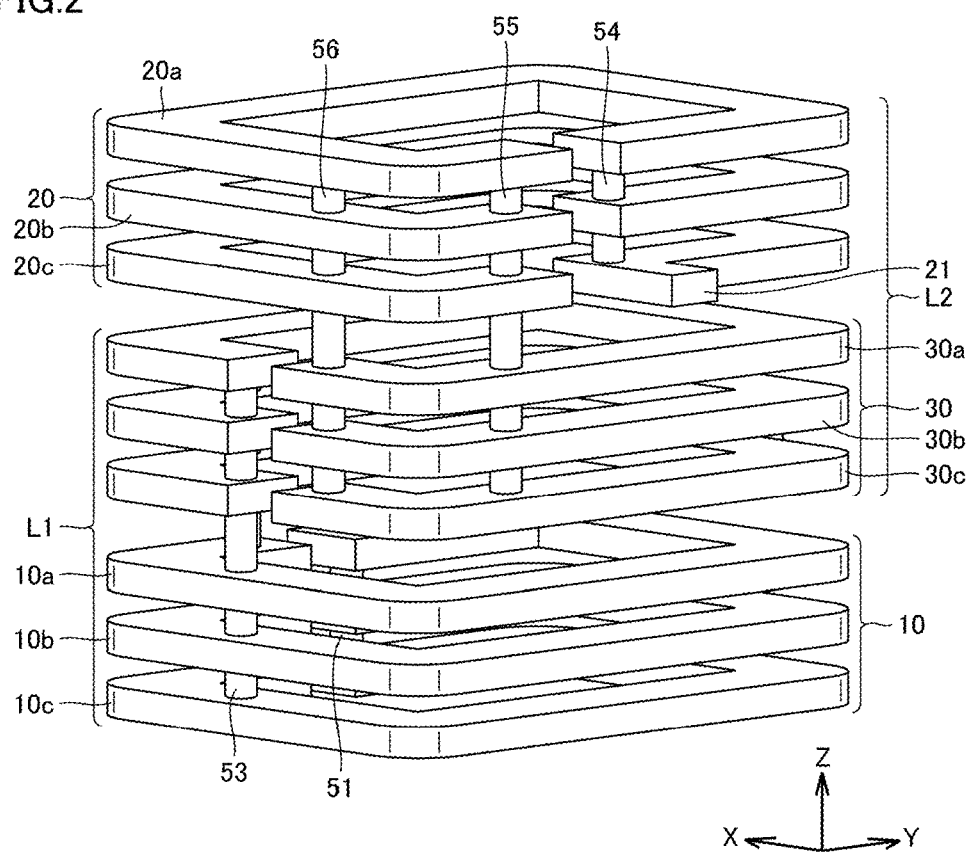
FIG. 2 is a perspective view for describing the structure of wiring patterns of a coil component according to a preferred embodiment of the present invention.
Figure 3:
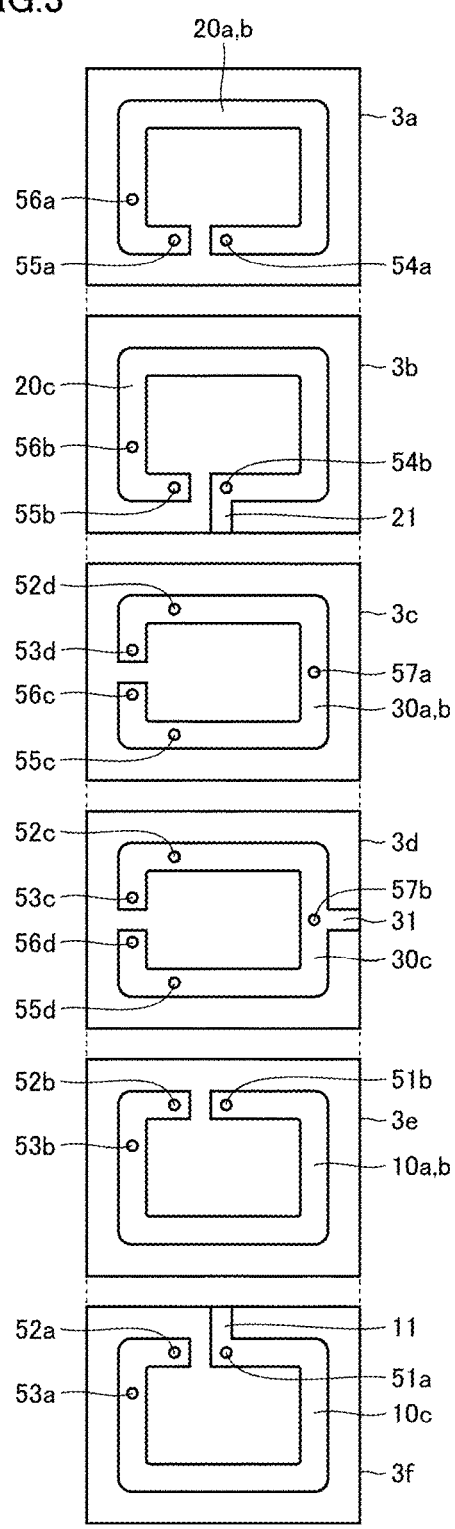
FIG. 3 is an exploded plan view illustrating the configuration of a coil component according to a preferred embodiment of the present invention.
Figure 4:
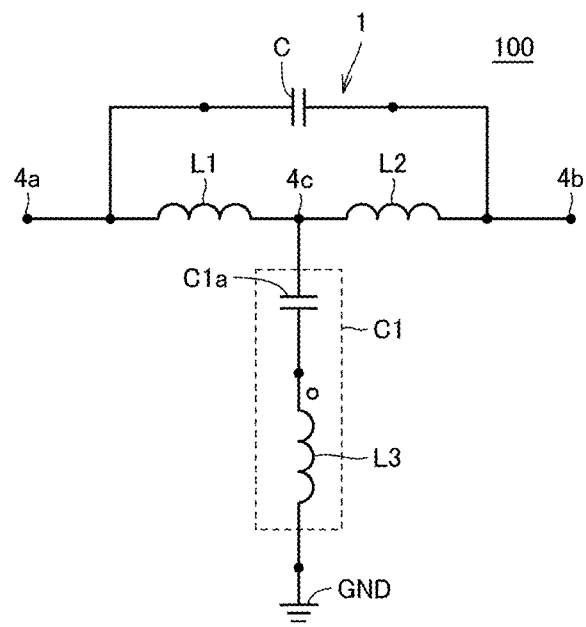
FIG. 4 is a circuit diagram of a filter circuit including a coil component according to a preferred embodiment of the present invention.

The coil component according to the present preferred embodiment will now be described with reference to the drawings. FIG. 1 is a perspective view of the coil component according to the present preferred embodiment. FIG. 2 is a perspective view for describing the structure of wiring patterns of the coil component according to the present preferred embodiment. FIG. 3 is an exploded plan view illustrating the configuration of the coil component according to the present preferred embodiment. FIG. 4 is a circuit diagram of a filter circuit including the coil component according to the present preferred embodiment. Referring to FIG. 1 and FIG. 2, the direction of the short sides of a coil component 1 is the X direction, the direction of the long sides thereof is the Y direction, and the height direction is the Z direction. The lamination direction of a substrate is the Z direction and the direction of an arrow in the Z direction indicates the upper layer direction.

A filter circuit 100 is preferably, for example, an EMI filter and is a third-order T-type LC filter circuit. The coil component 1 is included in the filter circuit 100. Although the third-order T-type LC filter circuit is used for description as the configuration of the filter circuit 100 in the present preferred embodiment, the coil component of the same configuration is applicable to a fifth-order T-type LC filter circuit or a higher-order T-type LC filter circuit, for example. The filter circuit 100 includes a capacitor C1, electrodes 4a, 4b, and 4c, a coil L1 (a first coil), and a coil L2 (a second coil), as illustrated in FIG. 4.

One end portion of the capacitor C1 is connected to the electrode 4c and the other end portion thereof is connected to a GND line, as illustrated in FIG. 4. The capacitor C1 is not limited to a multilayer ceramic capacitor including, for example, BaTiO$_3$ (barium titanate) as a principal component and may be a multilayer ceramic capacitor including another material as the principal component. The capacitor C1 may be a capacitor of another suitable kind, such as, for example, an aluminum electrolytic capacitor, which is not the multilayer ceramic capacitor. The capacitor C1 includes an inductor L3 as parasitic inductance (the equivalent series inductance (ESL)). The capacitor C1 is equivalent to a circuit configuration in which the inductor L3 is connected in series to a capacitor C1a. The capacitor C1 may be equivalent to a circuit configuration in which parasitic resistance (equivalent series resistance (ESR)) is further connected in series to the inductor L3 and the capacitor C1a.

In addition to the capacitor C1, the coil L1 and the coil L2 are connected to the electrode 4c. The coil L1 is magnetically coupled to the coil L2 to cause a negative inductance component. The parasitic inductance (the inductor L3) of the capacitor C1 is capable of being canceled using the negative inductance component to decrease the apparent magnitude of the inductance component of the capacitor C1. In the filter circuit 100 including the capacitor C1, the coil L1, and the coil L2, a noise reduction or prevention effect in a high frequency band is capable of being improved by canceling the parasitic inductance of the capacitor C1 with the negative inductance component caused by mutual inductance of the coil L1 and the coil L2.

The coil component 1 includes a multilayer body 3 (a ceramic body) including ceramic layers, in which multiple substrates (ceramic green sheets) including the wiring of the coils provided thereon are laminated, as illustrated in FIG. 1 to FIG. 3. The multilayer body 3 includes a pair of main surfaces that are opposed to each other and side surfaces with which the main surfaces are connected. Multiple first wiring patterns 10, multiple third wiring patterns 30, and multiple second wiring patterns 20 are sequentially laminated from the bottom so as to be parallel or substantially parallel to the main surfaces of the multilayer body 3 to define the coil L1 and the coil L2. Accordingly, the variation in magnetic coupling between the coil L1 and the coil L2 is capable of being controlled based on the accuracy of the lamination of the first wiring patterns 10 to the third wiring patterns 30.

The side surfaces of the multilayer body 3 include a first side surface (a side surface on which the electrode 4a (a first electrode) is provided) and a second side surface (a side surface on which the electrode 4b (a second electrode) is provided) at the side of the long sides, and a third side surface (a side surface on which the electrode 4c (a third electrode) is provided) and a fourth side surface (a side surface on which an electrode 4d is provided) at the side of the short sides.

In the coil component 1, wiring patterns 10a to 10c (the first wiring patterns 10), wiring patterns 20a to 20c (the second wiring patterns 20), and wiring patterns 30a to 30c (the third wiring patterns 30), which define the coils L1 and L2, are provided in the multilayer body 3, as illustrated in FIG. 2. A portion of the wiring patterns 30a to 30c defines the coil L1 and the remaining portion of the wiring patterns 30a to 30c defines the coil L2. In other words, the wiring patterns 30a to 30c include a common portion defining the coils L1 and L2. Providing the common portion of the coils L1 and L2, as in the third wiring patterns 30, enables the variation in the magnetic coupling between the coil L1 and the coil L2 to be reduced. The coil shapes of the coils L1 and L2 are line-symmetric or substantially line-symmetric with respect to the electrode 4c.

An end portion 11 of the wiring pattern 10c on the bottom layer, among the first wiring patterns 10 laminated on lower layers, is electrically connected to the electrode 4a. The other wiring patterns 10a and 10b are electrically connected to the wiring pattern 10c by a via conductor 51 (a first via conductor). The via conductor 51 may include one via conductor or may include multiple via conductors. It is sufficient for at least one first wiring pattern 10 (for example, the wiring pattern 10c), among the multiple first wiring patterns 10, to be electrically connected to the electrode 4a. If all of the multiple first wiring patterns 10 are electrically connected to the electrode 4a, it is not necessary to electrically connect the multiple first wiring patterns 10 to each other with the via conductor 51 that is provided. However, a crack is likely to occur during manufacturing when all of the multiple first wiring patterns 10 are electrically connected to the electrode 4a. In other words, the end portion 11 for electrically connecting to the electrode 4a for all of the multiple first wiring patterns 10 easily causes the crack when the multiple first wiring patterns 10 are laminated and hardened. If the crack is less likely to occur in manufacturing, a configuration may be provided in which all of the multiple first wiring patterns 10 are electrically connected to the electrode 4a and the via conductor 51 itself is not provided.

The number of the first wiring patterns 10 electrically connected to the electrode 4a is desirably smaller than the number of the multiple first wiring patterns 10 in view of the crack in manufacturing. In particular, a configuration is desirable in which one first wiring pattern (for example, the wiring pattern 10c), among the multiple first wiring patterns 10, is electrically connected to the electrode 4a. When the multiple first wiring patterns 10 are connected to the electrode 4a, a configuration may be adopted in which at least one layer of the first wiring pattern that is not electrically connected to the electrode 4a is included between one first wiring pattern 10 electrically connected to the electrode 4a and the other first wiring patterns 10. Specifically, when the multiple first wiring patterns 10 include the wiring patterns 10a to 10c, as illustrated in FIG. 2, the end portion 11 for electrically connecting to the electrode 4a is provided for the wiring patterns 10c and the end portion 11 for electrically connecting to the electrode 4a is not provided for the wiring pattern 10a and 10b.

An end portion 31 of the wiring pattern 30c on the bottom layer, among the third wiring patterns 30 laminated on middle layers, is electrically connected to the electrode 4c. The other wiring patterns 30a and 30b are electrically connected to the wiring pattern 30c by a via conductor 57 (a seventh via conductor). The via conductor 57 may include one via conductor or may include multiple via conductors. It is sufficient for at least one third wiring pattern 30 (for example, the wiring pattern 30c), among the multiple third wiring patterns 30, to be electrically connected to the electrode 4c. If all of the multiple third wiring patterns 30 are electrically connected to the electrode 4c, it is not necessary to electrically connect the multiple third wiring patterns 30 to each other with the via conductor 57 that is provided. Specifically, a configuration may be provided in which the via conductor 57 itself is not provided if the crack is less likely to occur during manufacturing, compared with a case in which the end portion for electrically connecting to the electrode is provided for all of the wiring patterns on upper layers and the lower layers, even when the end portion 31 for electrically connecting to the electrode 4c is provided for all of the third wiring patterns 30 laminated on the middle layers.

The number of the third wiring patterns 30 electrically connected to the electrode 4c is preferably smaller than the number of the multiple third wiring patterns 30 due to manufacturing. In particular, a configuration is preferable in which one third wiring pattern (for example, the wiring pattern 30c), among the multiple third wiring patterns 30, is electrically connected to the electrode 4c. When the multiple third wiring patterns 30 are connected to the electrode 4c, a configuration may be provided in which at least one layer of the third wiring pattern 30 that is not electrically connected to the electrode 4c is included between one third wiring pattern 30 electrically connected to the electrode 4c and the other third wiring patterns 30. Specifically, when the multiple third wiring patterns 30 include the wiring patterns 30a to 30c, as illustrated in FIG. 2, the end portion 31 for electrically connecting to the electrode 4c is provided for the wiring patterns 30c and the end portion 31 for electrically connecting to the electrode 4c is not provided for the wiring pattern 30a and 30b.

The third wiring patterns 30 laminated on the middle layers are electrically connected to the first wiring patterns 10 on the lower layers by via conductors 52 and 53. Each of the via conductors 52 and 53 may include one via conductor or may include multiple via conductors. The via conductors 52 and 53 are electrically connected to the wiring patterns 10a to 10c of the first wiring patterns 10 and the wiring patterns 30a to 30c of the third wiring patterns 30. The first wiring patterns 10 in which the via conductor 52 (a second via conductor) is provided and the first wiring patterns 10 in which the via conductor 53 (a third via conductor) is provided are at the sides of different side surfaces of the multilayer body 3. Specifically, as illustrated in FIG. 3, the first wiring patterns 10 in which the via conductor 52 is provided are at the side of the first side surface at the side of the long sides (connection portions 52a and 52b for connecting to the via conductor 52 are illustrated in FIG. 3), which is different from the side of the fourth side surface (connection portions 53a and 53b for connecting to the via conductor 53 are illustrated in FIG. 3) at the side of the short sides of the first wiring patterns 10 in which the via conductor 53 is provided.

Figure 5:
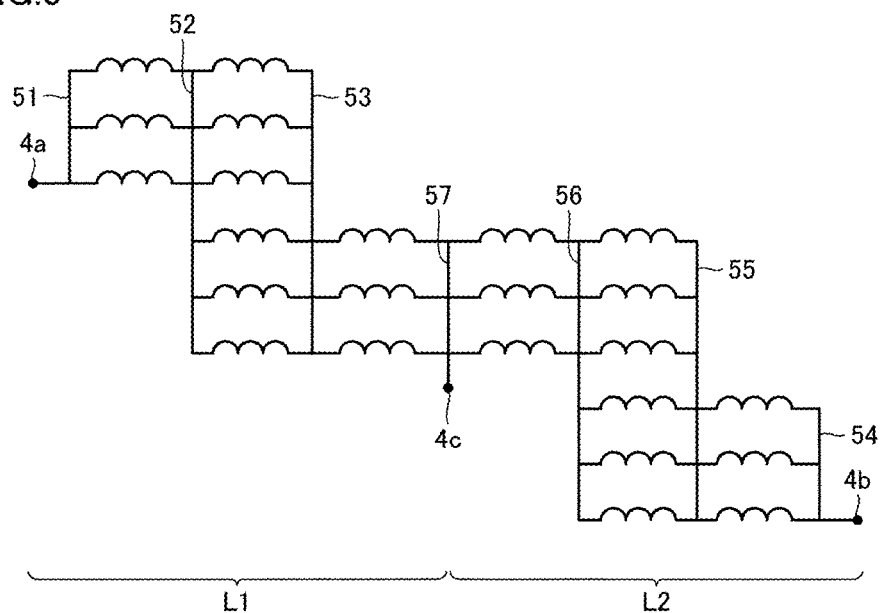
FIG. 5 is an equivalent circuit diagram of a coil component according to a preferred embodiment of the present invention.

In other words, the via conductor 52 and the via conductor 53 are provided across one corner of the first wiring patterns 10. A configuration is provided in which a portion of the three wiring patterns 10a to 10c is connected in parallel and the three inductors are connected in parallel to each other between the via conductor 51 and the via conductor 52. In addition, a configuration is provided in which a portion of the three wiring patterns 10a to 10c is connected in parallel and the three inductors are also connected in parallel to each other between the via conductor 52 and the via conductor 53. Furthermore, the via conductors 52 and 53 are also provided in the wiring patterns 30a to 30c of the third wiring patterns 30. Accordingly, a configuration is provided in which a portion of the three wiring patterns 30a to 30c is connected in parallel and the three inductors are connected in parallel to each other between the via conductor 52 and the via conductor 53. As a result, a configuration is provided in which the six inductors including the portion of the wiring patterns 10a to 10c are connected in parallel to each other. FIG. 5 is an equivalent circuit diagram of the coil component according to the present preferred embodiment. As illustrated in FIG. 5, the coil L1 includes the three inductors connected in parallel to each other between the via conductor 51 and the via conductor 52, the six inductors connected in parallel to each other between the via conductor 52 and the via conductor 53, and the three inductors connected in parallel to each other between the via conductor 53 and the via conductor 57. With such a configuration, the wiring between the via conductor 52 and the via conductor 53 and between a via conductor 55 and a via conductor 56 is doubled to decrease the resistance value, thus reducing or preventing heat generation.

The inductances of the six inductors generated between the via conductor 52 and the via conductor 53 are capable of being adjusted based the distance between the via conductor 52 and the via conductor 53. In particular, the distance between the position where the via conductor 52 is provided and the position where the via conductor 53 is provided is capable of being adjusted in a range shorter than the total value of half of the length of the fourth side surface (one side surface) at the side of the short sides of the multilayer body 3 and the length of the first side surface (another side surface orthogonal or substantially orthogonal to the one side surface) at the side of the long sides of the multilayer body 3. The mutual inductance of the two coils L1 and L2 is capable of being appropriately adjusted by adjusting the inductances of the six inductors connected in parallel to each other, which define the coil L1.

An end portion 21 of the wiring pattern 20c on the bottom layer, among the second wiring patterns 20 laminated on the upper layers, is electrically connected to the electrode 4b. The other wiring patterns 20a and 20b are electrically connected to the wiring pattern 20c by a via conductor 54 (a fourth via conductor). The via conductor 54 may include one via conductor or may include multiple via conductors. It is sufficient for at least one second wiring pattern (for example, the wiring pattern 20c), among the multiple second wiring patterns 20, to be electrically connected to the electrode 4b. If all of the multiple second wiring patterns are electrically connected to the electrode 4b, it is not necessary to electrically connect the multiple second wiring patterns 20 to each other with the via conductor 54 that is provided. However, a crack is likely to occur during manufacturing when all of the multiple second wiring patterns 20 are electrically connected to the electrode 4b. In other words, the end portion 21 for electrically connecting to the electrode 4b for all of the multiple second wiring patterns 20 easily causes the crack when the multiple second wiring patterns 20 are laminated and hardened. If the crack is less likely to occur during manufacturing, a configuration may be provided in which all of the multiple second wiring patterns 20 are electrically connected to the electrode 4b and the via conductor 54 itself is not provided.

The number of the second wiring patterns 20 electrically connected to the electrode 4b is preferably smaller than the number of the multiple second wiring patterns 20 in view of the crack during manufacturing. In particular, a configuration is preferable in which one second wiring pattern (for example, the wiring pattern 20c), among the multiple second wiring patterns 20, is electrically connected to the electrode 4b. When the multiple second wiring patterns 20 are connected to the electrode 4b, a configuration may be provided in which at least one layer of the second wiring pattern 20 that is not electrically connected to the electrode 4b is included between one second wiring pattern 20 electrically connected to the electrode 4b and the other second wiring patterns 20. Specifically, when the multiple second wiring patterns 20 include the wiring patterns 20a to 20c, as illustrated in FIG. 2, the end portion 21 for electrically connecting to the electrode 4b is provided for the wiring patterns 20c and the end portion 21 for electrically connecting to the electrode 4b is not provided for the wiring pattern 20a and 20b.

The second wiring patterns 20 laminated on the upper layers are electrically connected to the third wiring patterns 30 on the middle layers by the via conductors 55 and 56. Each of the via conductors 55 and 56 may include one via conductor or may include multiple via conductors. The via conductors 55 and 56 are electrically connected to the wiring patterns 20a to 20c of the second wiring patterns 20 and the wiring patterns 30a to 30c of the third wiring patterns 30. The second wiring patterns 20 in which the via conductor 55 (a fifth via conductor) is provided and the second wiring patterns 20 in which the via conductor 56 (a sixth via conductor) is provided are at the sides of different side surfaces of the multilayer body 3. Specifically, as illustrated in FIG. 3, the second wiring patterns 20 in which the via conductor 55 is provided are at the side of the second side surface at the side of the long sides (connection portions 55a and 55b for connecting to the via conductor 55 are illustrated in FIG. 3), which is different from the side of the fourth side surface (connection portions 56a and 56b for connecting to the via conductor 56 are illustrated in FIG. 3) at the side of the short sides of the second wiring patterns 20 in which the via conductor 56 is provided.

In other words, the via conductor 55 and the via conductor 56 are provided across one corner of the second wiring patterns 20. A configuration is provided in which a portion of the three wiring patterns 20a to 20c is connected in parallel and the three inductors are connected in parallel to each other between the via conductor 54 and the via conductor 55. In addition, a configuration is provided in which a portion of the three wiring patterns 20a to 20c is connected in parallel and the three inductors are also connected in parallel to each other between the via conductor 55 and the via conductor 56. Furthermore, the via conductors 55 and 56 are also provided in the wiring patterns 30a to 30c of the third wiring patterns 30. Accordingly, a configuration is provided in which a portion of the three wiring patterns 30a to 30c is connected in parallel and the three inductors are connected in parallel to each other between the via conductor 55 and the via conductor 56. As a result, a configuration is provided in which the six inductors including the portion of the wiring patterns 20a to 20c are connected in parallel to each other. As illustrated in FIG. 5, the coil L2 includes the three inductors connected in parallel to each other between the via conductor 54 and the via conductor 55, the six inductors connected in parallel to each other between the via conductor 55 and the via conductor 56, and the three inductors connected in parallel to each other between the via conductor 56 and the via conductor 57.

The inductances of the six inductors provided between the via conductor 55 and the via conductor 56 are capable of being adjusted based on the distance between the via conductor 55 and the via conductor 56. In particular, the distance between the position where the via conductor 55 is provided and the position where the via conductor 56 is provided is capable of being adjusted in a range shorter than the total value of half of the length of the fourth side surface (one side surface) at the side of the short sides of the multilayer body 3 and the length of the second side surface (another side surface orthogonal or substantially orthogonal to the one side surface) at the side of the long sides of the multilayer body 3. The mutual inductance of the two coils L1 and L2 is capable of being appropriately adjusted by adjusting the inductances of the six inductors connected in parallel to each other, which define the coil L2.

Each of the first wiring patterns 10, the second wiring patterns 20, and the third wiring patterns 30 is formed by applying a conductive paste (Ni paste) on ceramic green sheets 3a to 3f, which are substrates, through screen printing, for example, as illustrated in FIG. 3. The wiring patterns 20a and 20b are provided on the ceramic green sheet 3a. The wiring patterns 20a and 20b each extend around counterclockwise in FIG. 3 along the respective sides from the center or approximate of the long side at the lower side in FIG. 3 of the ceramic green sheet 3a and a gap is provided between the starting end and the trailing end. In addition, the wiring patterns 20a and 20b include a connection portion 54a connected to the via conductor 54 at the starting end, the connection portion 56a connected to the via conductor 56 on the short side at the left side in FIG. 3, and the connection portion 55a connected to the via conductor 55 at the trailing end.

The wiring pattern 20c is provided on the ceramic green sheet 3b. The wiring pattern 20c extends around counterclockwise in FIG. 3 along the respective sides from the center or approximate center of the long side at the lower side in FIG. 3 of the ceramic green sheet 3b and a gap is provided between the starting end and the trailing end. In addition, the wiring pattern 20c includes the end portion 21 for connecting to the electrode 4b at the starting end. Furthermore, the wiring pattern 20c has a connection portion 54b connected to the via conductor 54 at the starting end, the connection portion 56b connected to the via conductor 56 on the short side at the left side in FIG. 3, and the connection portion 55b connected to the via conductor 55 at the trailing end. The two ceramic green sheets 3a and the one ceramic green sheet 3b are laminated (a total of three layers) to define the second wiring patterns 20 illustrated in FIG. 1.

The wiring patterns 30a and 30b are provided on the ceramic green sheet 3c. The wiring patterns 30a and 30b each extend around counterclockwise in FIG. 3 along the respective sides from the center or approximate center of the short side at the left side in FIG. 3 of the ceramic green sheet 3c and a gap is formed between the starting end and the trailing end. In addition, the wiring patterns 30a and 30b include a connection portion 56c connected to the via conductor 56 at the starting end, a connection portion 55c connected to the via conductor 55 on the long side at the lower side in FIG. 3, a connection portion 57a connected to the via conductor 57 on the short side at the right side in FIG. 3, a connection portion 52d connected to the via conductor 52 on the long side at the upper side in FIG. 3, and a connection portion 53d connected to the via conductor 53 at the trailing end.

The wiring pattern 30c is provided on the ceramic green sheet 3d. The wiring pattern 30c extends around counterclockwise in FIG. 3 along the respective sides from the center or approximate center of the short side at the left side in FIG. 3 of the ceramic green sheet 3d and a gap is provided between the starting end and the trailing end. In addition, the wiring pattern 30c includes the end portion 31 for connecting to the electrode 4c at the center or approximate center of the short side at the right side in FIG. 3. Furthermore, the wiring pattern 30c includes a connection portion 56d connected to the via conductor 56 at the starting end, a connection portion 55d connected to the via conductor 55 on the long side at the lower side in FIG. 3, a connection portion 57b connected to the via conductor 57 on the short side at the right side in FIG. 3, a connection portion 52c connected to the via conductor 52 on the long side at the upper side in FIG. 3, and a connection portion 53c connected to the via conductor 53 at the trailing end. The two ceramic green sheets 3c and the one ceramic green sheet 3d are laminated (a total of three layers) to define the third wiring patterns 30 illustrated in FIG. 1.

The wiring patterns 10a and 10b are provided on the ceramic green sheet 3e. The wiring patterns 10a and 10b each extend around clockwise in FIG. 3 along the respective sides from the center or approximate center of the long side at the upper side in FIG. 3 of the ceramic green sheet 3e and a gap is provided between the starting end and the trailing end. In addition, the wiring patterns 10a and 10b include a connection portion 51b connected to the via conductor 51 at the starting end, the connection portion 53b connected to the via conductor 53 on the short side at the left side in FIG. 3, and the connection portion 52b connected to the via conductor 52 at the trailing end.

The wiring pattern 10c is provided on the ceramic green sheet 3f. The wiring pattern 10c extends around clockwise in FIG. 3 along the respective sides from the center or approximate center of the long side at the upper side in FIG. 3 of the ceramic green sheet 3f and a gap is provided between the starting end and the trailing end. In addition, the wiring pattern 10c includes the end portion 11 for connecting to the electrode 4a at the starting end. Furthermore, the wiring pattern 10c includes a connection portion 51a connected to the via conductor 51 at the starting end, the connection portion 53a connected to the via conductor 53 on the short side at the left side in FIG. 3, and the connection portion 52a connected to the via conductor 52 at the trailing end. The two ceramic green sheets 3e and the one ceramic green sheet 3f are laminated (a total of three layers) to define the first wiring patterns 10 illustrated in FIG. 1.

In the coil component 1, at least one layer of the ceramic green sheet 3a, at least one layer of the ceramic green sheet 3b, at least one layer of the ceramic green sheet 3c, at least one layer of the ceramic green sheet 3d, at least one layer of the ceramic green sheet 3e, and at least one layer of the ceramic green sheet 3f, illustrated in FIG. 3, are laminated and multiple ceramic green sheets (dummy layers) on which no wiring pattern is printed are laminated on both of the upper and lower sides of the respective ceramic green sheets. The multiple ceramic green sheets including the dummy layers are subjected to pressure bonding to form the multilayer body 3 (the ceramic body) that is not fired. The multilayer body 3 is fired and a copper electrode is baked on the outside of the fired multilayer body 3 so as to be electrically connected to the wiring patterns to form the electrodes 4a to 4d.

In the coil component 1, the multiple ceramic green sheets are laminated, on which the first wiring patterns 10, the second wiring patterns 20, and the third wiring patterns 30, which define the coils L1 and L2, are provided. Accordingly, in the coil component 1, it is possible to reduce the variation in the magnetic coupling between the coil L1 and the coil L2 having a multilayer structure including the first wiring patterns 10, the second wiring patterns 20, and the third wiring patterns 30.

As described above, the coil component 1 is formed by laminating the multiple wiring patterns corresponding to a metal portion and the multiple ceramic green sheets corresponding to a ceramic portion and applying pressure to the wiring patterns and the ceramic green sheets that are laminated. However, since the metal portion has a malleability different from that of the ceramic portion, a crack may occur in the multilayer body 3 due to the difference in the compressibility between the metal portion and the ceramic portion during the application of pressure. Since the firing is performed after the application of pressure in the coil component 1, as described above, a crack may occur in the multilayer body 3 due to the difference in the rate of thermal contraction between the metal portion and the ceramic portion during the firing.

Accordingly, in the coil component 1 according to the present preferred embodiment, the number of the wiring patterns for which the end portion 11 for connecting to the electrode 4a is provided, among the first wiring patterns 10, is decreased such that the crack is less likely to occur during the manufacturing. Similarly, in the coil component 1, the number of the wiring patterns for which the end portion 21 for connecting to the electrode 4b is provided, among the second wiring patterns 20, may be decreased or the number of the wiring patterns for which the end portion 31 for connecting to the electrode 4c is provided, among the third wiring patterns 30, may be decreased.

Figure 6:
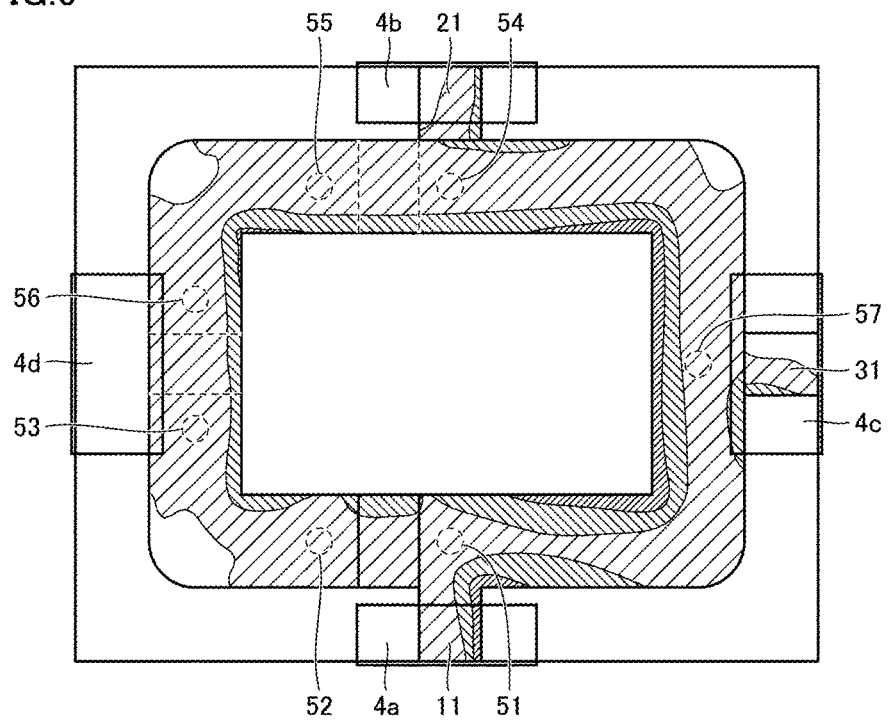
FIG. 6 is a diagram schematically illustrating a result of simulation of current concentration when a large current is caused to flow through a coil component 1 according to a preferred embodiment of the present invention.
Figure 7:
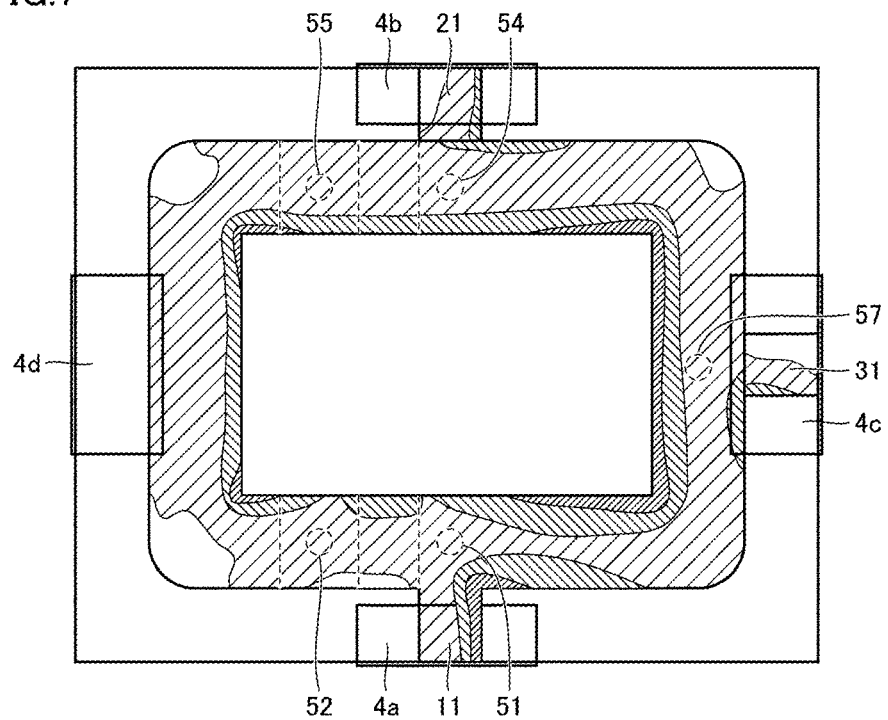
FIG. 7 is a diagram schematically illustrating a result of simulation of current concentration when large current is caused to flow through a coil component according to a comparative example.

In the coil component 1 according to the present preferred embodiment, the via conductors 52 and 53 are provided to connect the first wiring patterns 10 to the third wiring patterns 30 and the via conductors 55 and 56 are provided to connect the second wiring patterns 20 to the third wiring patterns 30. In the coil component 1, electrically connecting the multiple wiring patterns with the multiple via conductors enables concentration of current to be reduced or prevented in the wiring of the coils L1 and L2 even if a large direct current is caused to flow through the coils L1 and L2. FIG. 6 is a diagram schematically illustrating a result of simulation of the current concentration when a large current is caused to flow through the coil component according to the present preferred embodiment. FIG. 7 is a diagram schematically illustrating a result of simulation of the current concentration when a large current is caused to flow through a coil component according to a comparative example. Referring to FIG. 6 and FIG. 7, the degree of current concentration is schematically illustrated using the density of hatching and portions having higher densities of hatching have higher degrees of current concentration. With such a configuration, the current concentration in the high frequency band is reduced or prevented to enable stable adjustment of mutual inductance M.

In the coil component of the comparative example illustrated in FIG. 7, only the via conductor 52 is provided to connect the first wiring patterns 10 to the third wiring patterns 30 and only the via conductor 55 is provided to connect the second wiring patterns 20 to the third wiring patterns 30. In other words, the coil component of the comparative example has a configuration in which the via conductors 53 and 56 are removed from the coil component 1 illustrated in FIG. 6. Accordingly, in the coil component of the comparative example, the multiple wiring patterns are electrically connected to each other by one via conductor. The result of simulation illustrated in FIG. 6 indicates that the degree of current concentration is particularly decreased in the portion where the via conductors 52 and 53 are provided, compared with the result of simulation illustrated in FIG. 7. In addition, the result of simulation illustrated in FIG. 6 indicates that the portion in which the degree of current concentration is high is also reduced in size in the portion where the via conductors 55 and 56 are provided, compared with the result of simulation illustrated in FIG. 7.

The configuration is described in the coil component 1 illustrated in FIG. 1, in which the coil L1 has the same or substantially the same inductance as that of the coil L2. However, the coil component 1 is not limited to the case in which the coil L1 has the same or substantially the same inductance as that of the coil L2. The mutual inductance M necessary to cancel the parasitic inductance of the capacitor C1 is calculated from $M = k (L1 \times L2)^{-2}$ where k denotes a coupling coefficient. Accordingly, an infinite combination of the inductance of the coil L1 and the inductance of the coil L2 is available even with the same or substantially the same value of the mutual inductance M.

Figure 8:
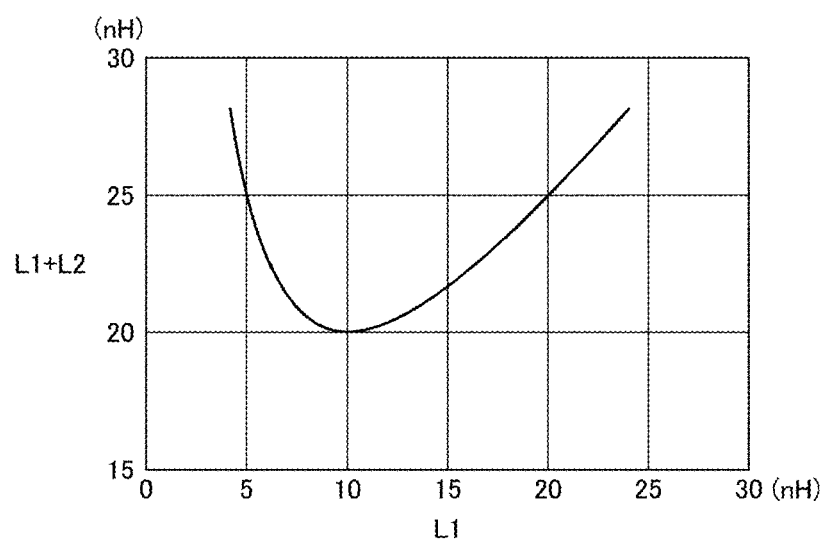
FIG. 8 is a diagram for describing a combination of mutual inductance M, the inductance of a coil L1, and the inductance of a coil L2.

FIG. 8 is a diagram for describing a combination of the mutual inductance M, the inductance of the coil L1, and the inductance of the coil L1. FIG. 8 is a graph indicating how the sum (L1+L2) of the inductance of the coil L1 and the inductance of the coil L2 is varied with respect to the inductance (L1) of the coil L1 when the mutual inductance M is fixed to a certain value (for example, about 10 nH). The graph in FIG. 8 indicates that the sum (L1+L2) of the inductance of the coil L1 and the inductance of the coil L2 has a minimum value (for example, about 20 nH) when both the inductance of the coil L1 and the inductance of the coil L2 have a value of about 10 nH.

The size of the coil component 1 is reduced to reduce degradation of the characteristics due to conductor loss when the sum (L1+L2) of the inductance of the coil L1 and the inductance of the coil L2 has a lower value with the same or substantially the same value of the mutual inductance M. Accordingly, although the coil component 1 preferably has a configuration in which the coil L1 and the coil L2 has the same or substantially the same inductance, the sum (L1+L2) of the inductance of the coil L1 and the inductance of the coil L2 has a value within about ±25% of the minimum value if the ratio of the inductance of the coil L1 to the inductance of the coil L2 is about one to four or less. Specifically, although the ratio of the inductance of the coil L1 to the inductance of the coil L2 is about one to four when the inductance of the coil L1 is about 5 nH and the inductance of the coil L2 is about 20 nH, the sum (L1+L2) of the inductance of the coil L1 and the inductance of the coil L2 is about 25 nH and is about 25% higher than the minimum value (about 20 nH).

As described above, in the coil component 1 according to the present preferred embodiment, the coil L1 is magnetically coupled to the coil L2. The coil component 1 includes the multilayer body 3, the multiple first wiring patterns 10, the multiple second wiring patterns 20, and the multiple third wiring patterns 30. The multilayer body 3 includes the multiple ceramic layers that are laminated and includes a pair of main surfaces that are opposed to each other and side surfaces with which the main surfaces are connected. The multiple first wiring patterns 10 are laminated in the multilayer body 3 and define a portion of the coil L1. The multiple second wiring patterns 20 are laminated above the first wiring patterns 10 and define a portion of the coil L2. The multiple third wiring patterns 30 are laminated between the first wiring patterns 10 and the second wiring patterns 20 and include a portion defining a portion of the coil L1 and a portion defining a portion of the coil L2. The coil L1 includes a portion in which the multiple first wiring patterns 10 are electrically connected to each other by the via conductor 51 to connect in parallel the multiple wiring patterns and a portion in which the multiple first wiring patterns 10 and the multiple third wiring patterns 30 are electrically connected to each other by the via conductor 52 and the via conductor 53 through the multiple first wiring patterns 10 and the multiple third wiring pattern 30 to connect the multiple wiring patterns in parallel. The coil L2 includes a portion in which the multiple second wiring patterns 20 are electrically connected to each other by the via conductor 54 to connect the multiple wiring patterns in parallel and a portion in which the multiple second wiring patterns 20 and the multiple third wiring patterns 30 are electrically connected to each other by the via conductor 55 and the via conductor 56 through the multiple second wiring patterns 20 and the multiple third wiring pattern 30 to connect the multiple wiring patterns in parallel. The multilayer body 3 includes the electrode 4a electrically connected to the first wiring patterns 10, the electrode 4b electrically connected to the second wiring patterns 20, and the electrode 4c electrically connected to the third wiring patterns 30 electrically connected to each other by the via conductor 57. With this configuration, since the multiple first wiring patterns 10 are electrically connected to the multiple third wiring patterns 30 by the via conductor 52 and the via conductor 53 and the multiple second wiring patterns 20 are electrically connected to the multiple third wiring patterns 30 by the via conductor 55 and the via conductor 56 in the coil component 1 according to the present preferred embodiment, it is possible to reduce or prevent the concentration of current in the wiring of the coils, to enable appropriate adjustment of the mutual inductance of the two coils, and to provide the parallel connection of the inductances at multiple portions to reduce or prevent the heat generation in the coils L1 and L2.

In the coil component 1, the first wiring patterns 10 including the via conductor 52 provided therein and the first wiring patterns 10 including the via conductor 53 provided therein may be at the sides of different side surfaces of the multilayer body 3 and the second wiring patterns 20 including the via conductor 55 provided therein and the second wiring patterns 20 including the via conductor 56 provided therein may be at the sides of different side surfaces of the multilayer body 3. With this configuration, the coil component 1 is capable of reducing or preventing the concentration of current at the corner of the first wiring patterns 10 or the second wiring patterns 20.

In the coil component 1, the distance between the position where the via conductor 52 is provided and the position where the via conductor 53 is provided and the distance between the position where the via conductor 55 is provided and the position where the via conductor 56 is provided may be shorter than the total value of half of the length of one side surface of the multilayer body 3 and the length of another side surface orthogonal or substantially orthogonal to the one side surface. With this configuration, in the coil component 1, it is possible to appropriately adjust the mutual inductance of the two coils based on the distance between the position where the via conductor is provided and the position where the via conductor 53 is provided or the distance between the position where the via conductor 55 is provided and the position where the via conductor 56 is provided.

In the coil component 1, at least one of the via conductor 51 to the via conductor 57 may include multiple via conductors. In other words, each of the via conductor 51 to the via conductor 57 may include one via conductor or may include multiple via conductors.

In the coil component 1, at least one first wiring pattern 10, among the multiple first wiring patterns 10, may be electrically connected to the electrode 4a, at least one second wiring pattern 20, among the multiple second wiring patterns 20, may be electrically connected to the electrode 4b, and at least one third wiring pattern 30, among the multiple third wiring patterns 30, may be electrically connected to the electrode 4c. In addition, in the coil component 1, the number of the first wiring patterns 10 electrically connected to the electrode 4a may be smaller than the number of the multiple first wiring patterns 10, the number of the second wiring patterns 20 electrically connected to the electrode 4b may be smaller than the number of the multiple second wiring patterns 20, and the number of the third wiring patterns 30 electrically connected to the electrode 4c may be smaller than the number of the multiple third wiring patterns 30. With this configuration, it is possible to reduce the likelihood that a crack will occur in the coil component 1 during the manufacturing.

In addition, in the coil component 1, at least one layer of the first wiring pattern 10 that is not electrically connected to the electrode 4a may be included between one first wiring pattern 10 electrically connected to the electrode 4a and the other first wiring patterns 10, at least one layer of the second wiring pattern 20 that is not electrically connected to the electrode 4b may be included between one second wiring pattern 20 electrically connected to the 4b electrode and the other second wiring patterns 20, and at least one layer of the third wiring pattern 30 that is not electrically connected to the electrode 4c may be included between one third wiring pattern 30 electrically connected to the electrode 4c and the other third wiring patterns 30. In addition, in the coil component 1, one first wiring pattern 10, among the multiple first wiring patterns 10, may be electrically connected to the electrode 4a, one second wiring pattern 20, among the multiple second wiring patterns 20, may be electrically connected to the electrode 4b, and one third wiring pattern 30, among the multiple third wiring patterns 30, may be electrically connected to the electrode 4c.

In the coil component 1, all of the multiple third wiring patterns 30 may be electrically connected to the electrode 4c without using the via conductor 57. With this configuration, it is not necessary to provide the via conductor 57 so as to simplify the structure in the coil component 1. In addition, in the coil component 1, all of the multiple first wiring patterns 10 may be electrically connected to the electrode 4a without using the via conductor 51. With this configuration, it is not necessary to provide the via conductor 51 so as to simplify the structure in the coil component 1. Furthermore, all of the multiple second wiring patterns 20 may be electrically connected to the electrode 4b without using the via conductor 54. With this configuration, it is not necessary to provide the via conductor 54 so as to simplify the structure in the coil component 1. In the coil component 1, a combination of all of the configurations including the configuration in which all of the third wiring patterns 30 are electrically connected to the electrode 4c without using the via conductor 57, the configuration in which all of the multiple first wiring patterns 10 are electrically connected to the electrode 4a without using the via conductor 51, and the configuration in which all of the multiple second wiring patterns 20 are electrically connected to the electrode 4b without using the via conductor 54 or a combination of a portion of the above-described configurations is available.

In the coil component 1, the ratio of the inductance of the coil L1 to the inductance of the coil L2 may preferably be about one to four or less, for example. With this configuration, it is possible to reduce the size of the coil component 1 so as to reduce degradation of the characteristics due to the conductor loss.

Furthermore, the filter circuit 100 includes the coil component 1 described above and the capacitor C1 connected to one end (the electrode 4c) of the multiple coils L1 and L2 magnetically coupled to each other in the coil component 1. With this configuration, the mutual inductance of the two coils included in the coil component 1 is capable of being appropriately adjusted so as to cancel the parasitic inductance in the filter circuit 100 and the parallel connection of the inductances is provided at multiple portions to reduce or prevent the heat generation in the coils L1 and L2.

Although each of the first wiring patterns 10, the second wiring patterns 20, and the third wiring patterns 30 is described as being provided by laminating the three wiring patterns in the coil component 1 described above, it is sufficient for each of the first wiring patterns 10, the second wiring patterns 20, and the third wiring patterns 30 to have a configuration in which two or more wiring patterns are laminated.

Although the via conductor 53 and the via conductor 56 are described as being electrically connected to all of the wiring patterns in the multiple third wiring patterns 30 in the coil component 1 described above, the via conductor 53 and the via conductor 56 may not be electrically connected to all of the wiring patterns. In other words, it is sufficient for the via conductor 53 and the via conductor 56 to be connected to at least one wiring pattern, among the multiple third wiring patterns 30. In the coil component 1, it is possible to appropriately adjust the mutual inductance of the two coils based on the number of the wiring patterns to which the via conductor 53 and the via conductor 56 are electrically connected.

Although the coil component 1 described above is described as including the multilayer body 3 (the ceramic body) including the multiple ceramic layers that are laminated, it is sufficient for the coil component 1 to have a multilayer structure of dielectric bodies.

Although it is assumed in the coil component 1 described above that the first wiring patterns 10, the second wiring patterns 20, and the third wiring patterns 30 have the same or substantially the same thickness, the respective wiring patterns may have different thicknesses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil component comprising:
   a first coil and a second coil that are magnetically coupled to each other;
   a ceramic body including a plurality of ceramic layers and including a pair of main surfaces opposed to each other and side surfaces with which the pair of main surfaces are connected;
   a plurality of first wiring patterns laminated in the ceramic body and defining of the first coil;
   a plurality of second wiring patterns laminated above the first wiring patterns and defining a portion of the second coil; and
   a plurality of third wiring patterns laminated between the plurality of first wiring patterns and the plurality of second wiring patterns and including a portion defining a portion of the first coil and a portion defining a portion of the second coil; wherein
   the first coil includes:
     a portion in which the plurality of first wiring patterns are electrically connected to each other via a first via conductor to connect the plurality of first wiring patterns in parallel; and
     a portion in which the plurality of first wiring patterns and the plurality of third wiring patterns are electrically connected to each other via a second via conductor and a third via conductor through the plurality of first wiring patterns and the plurality of third wiring patterns to connect the plurality of first, second, and third wiring patterns in parallel;
   the second coil includes:
     a portion in which the plurality of second wiring patterns are electrically connected to each other via a fourth via conductor to connect the plurality of first wiring patterns in parallel; and
     a portion in which the plurality of second wiring patterns and the plurality of third wiring patterns are electrically connected to each other via a fifth via conductor and a sixth via conductor through the plurality of second wiring patterns and the plurality of third wiring patterns to connect the plurality of first, second, and third wiring patterns in parallel; and
   the ceramic body includes:
     a first electrode electrically connected to the plurality of first wiring patterns;
     a second electrode electrically connected to the plurality of second wiring patterns; and
     a third electrode electrically connected to the plurality of third wiring patterns electrically connected to each other via a seventh via conductor.

2. The coil component according to claim 1, wherein
   the plurality of first wiring patterns in which the second via conductor is provided and the plurality of first wiring patterns in which the third via conductor is provided are at the sides of different side surfaces of the ceramic body; and
   the plurality of second wiring patterns in which the fifth via conductor is provided and the plurality of second wiring patterns in which the sixth via conductor is provided are at the sides of different side surfaces of the ceramic body.

3. The coil component according to claim 2, wherein a distance between a position where the second via conductor is provided and a position where the third via conductor is provided and a distance between a position where the fifth via conductor is provided and a position where the sixth via conductor is provided are shorter than a total value of half of a length of one of the side surfaces of the ceramic body and a length of another one of the side surfaces orthogonal or substantially orthogonal to the one side surface.

4. The coil component according to claim 1, wherein at least one of the first, second, third, fourth, fifth, sixth, and seventh via conductors includes a plurality of via conductors.

5. The coil component according to claim 1, wherein a ratio of an inductance of the first coil to an inductance of the second coil is about one to four or less.

6. The coil component according to claim 1, wherein
   a number of the first wiring patterns electrically connected to the first electrode is smaller than a number of the plurality of first wiring patterns;
   a number of the second wiring patterns electrically connected to the second electrode is smaller than a number of the plurality of second wiring patterns; and
   a number of the third wiring patterns electrically connected to the third electrode is smaller than a number of the plurality of third wiring patterns.

7. The coil component according to claim 1, wherein
   at least one layer of the plurality of first wiring patterns is not electrically connected to the first electrode, and is disposed between one first wiring pattern of the plurality of first wiring patterns electrically connected to the first electrode and remaining ones of the plurality of first wiring patterns;
   at least one layer of the plurality of second wiring patterns is not electrically connected to the second electrode, and is disposed between one second wiring pattern of the plurality of second wiring patterns electrically connected to the second electrode and remaining ones of the plurality of second wiring patterns; and
   at least one layer of the plurality of third wiring patterns is not electrically connected to the third electrode, and is disposed between one third wiring pattern of the plurality of third wiring patterns electrically connected to the third electrode and remaining ones of the plurality of third wiring patterns.

8. The coil component according to claim 1, wherein
only one first wiring pattern, among the plurality of first wiring patterns, is electrically connected to the first electrode;
only one second wiring pattern, among the plurality of second wiring patterns, is electrically connected to the second electrode; and
only one third wiring pattern, among the plurality of third wiring patterns, is electrically connected to the third electrode.

9. The coil component according to claim 1, wherein all of the plurality of third wiring patterns are electrically connected to the third electrode without using the seventh via conductor.

10. The coil component according to claim 1, wherein all of the plurality of first wiring patterns are electrically connected to the first electrode without using the first via conductor.

11. The coil component according to claim 1, wherein all of the plurality of second wiring patterns are electrically connected to the second electrode without using the fourth via conductor.

12. A filter circuit comprising:
the coil component according to claim 1; and
a capacitor connected to the third electrode of the coil component.

13. The filter circuit according to claim 12, wherein
the plurality of first wiring patterns in which the second via conductor is provided and the plurality of first wiring patterns in which the third via conductor is provided are at the sides of different side surfaces of the ceramic body; and
the plurality of second wiring patterns in which the fifth via conductor is provided and the plurality of second wiring patterns in which the sixth via conductor is provided are at the sides of different side surfaces of the ceramic body.

14. The filter circuit according to claim 13, wherein a distance between a position where the second via conductor is provided and a position where the third via conductor is provided and a distance between a position where the fifth via conductor is provided and a position where the sixth via conductor is provided are shorter than a total value of half of a length of one of the side surfaces of the ceramic body and a length of another one of the side surfaces orthogonal or substantially orthogonal to the one side surface.

15. The filter circuit according to claim 12, wherein at least one of the first, second, third, fourth, fifth, sixth, and seventh via conductors includes a plurality of via conductors.

16. The filter circuit according to claim 13, wherein
a number of the first wiring patterns electrically connected to the first electrode is smaller than a number of the plurality of first wiring patterns;
a number of the second wiring patterns electrically connected to the second electrode is smaller than a number of the plurality of second wiring patterns; and
a number of the third wiring patterns electrically connected to the third electrode is smaller than a number of the plurality of third wiring patterns.

17. The filter circuit according to claim 12, wherein
at least one layer of the plurality of first wiring patterns is not electrically connected to the first electrode, and is disposed between one first wiring pattern of the plurality of first wiring patterns electrically connected to the first electrode and remaining ones of the plurality of first wiring patterns;
at least one layer of the plurality of second wiring patterns is not electrically connected to the second electrode, and is disposed between one second wiring pattern of the plurality of second wiring patterns electrically connected to the second electrode and remaining ones of the plurality of second wiring patterns; and
at least one layer of the plurality of third wiring patterns is not electrically connected to the third electrode, and is disposed between one third wiring pattern of the plurality of third wiring patterns electrically connected to the third electrode and remaining ones of the plurality of third wiring patterns.

18. The filter circuit according to claim 12, wherein
only one first wiring pattern, among the plurality of first wiring patterns, is electrically connected to the first electrode;
only one second wiring pattern, among the plurality of second wiring patterns, is electrically connected to the second electrode; and
only one third wiring pattern, among the plurality of third wiring patterns, is electrically connected to the third electrode.

* * * * *